United States Patent
Lim

(10) Patent No.: US 11,204,698 B2
(45) Date of Patent: Dec. 21, 2021

(54) MEMORY CONTROLLER TO SET OPERATING ENVIRONMENT OF MEMORY DEVICE, METHOD OF OPERATING THE SAME AND STORAGE DEVICE INCLUDING THE SAME

(71) Applicant: SK hynix Inc., Gyeonggi-do (KR)

(72) Inventor: Su Jin Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 153 days.

(21) Appl. No.: 16/541,741

(22) Filed: Aug. 15, 2019

(65) Prior Publication Data
US 2020/0183592 A1 Jun. 11, 2020

(30) Foreign Application Priority Data
Dec. 11, 2018 (KR) .................. 10-2018-0159496

(51) Int. Cl.
*G06F 3/06* (2006.01)

(52) U.S. Cl.
CPC .......... *G06F 3/0614* (2013.01); *G06F 3/0655* (2013.01); *G06F 3/0679* (2013.01)

(58) Field of Classification Search
CPC .... G06F 3/0614; G06F 3/0655; G06F 3/0679; G06F 3/0619; G06F 3/0653; G06F 3/0656; G06F 3/0658; G06F 3/0659; G06F 3/0668; G06F 3/0688; G06F 3/0685; G06F 13/1673; G06F 11/0793; G06F 11/073; G11C 11/5642; G11C 29/021; G11C 29/028; G11C 29/52
See application file for complete search history.

(56) References Cited

U.S. PATENT DOCUMENTS

| | | | |
|---|---|---|---|
| 2010/0118608 A1* | 5/2010 | Song | G11C 16/26 365/185.11 |
| 2011/0060875 A1* | 3/2011 | Haukness | G11C 16/10 711/103 |
| 2013/0036261 A1* | 2/2013 | Kim | G06F 11/1048 711/103 |
| 2013/0258778 A1* | 10/2013 | Oh | G11C 16/26 365/185.11 |
| 2015/0113322 A1* | 4/2015 | Lee | G11C 29/021 714/15 |
| 2019/0286518 A1* | 9/2019 | Asami | G11C 29/42 |

FOREIGN PATENT DOCUMENTS

| | | |
|---|---|---|
| KR | 10-1434404 | 8/2014 |
| KR | 10-1498669 | 3/2015 |

* cited by examiner

*Primary Examiner* — Michael Krofcheck
(74) *Attorney, Agent, or Firm* — IP & T Group LLP

(57) ABSTRACT

A memory controller controls a memory device including a plurality of memory cells. The memory controller may include a workload determination circuit configured to determine a workload state indicating an operating pattern of the memory device based on optimal read voltages for reading the plurality of memory cells when a read operation performed on the memory cells fails; and an operating environment setting circuit configured to set an operating environment of the memory device based on the workload state.

19 Claims, 15 Drawing Sheets

FIG. 2
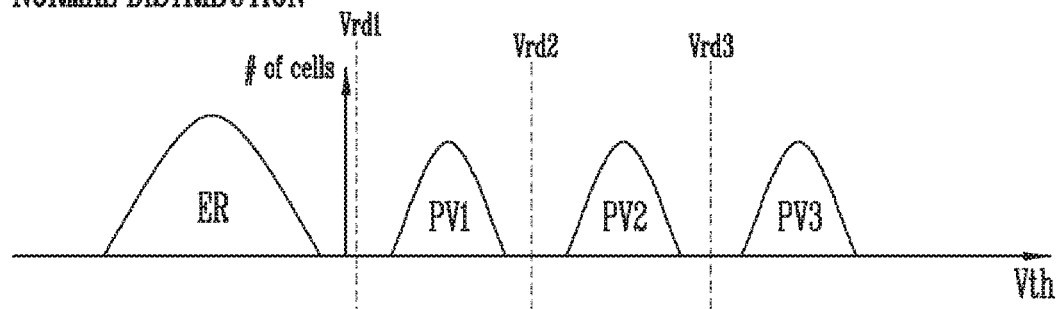
(a) NORMAL DISTRIBUTION
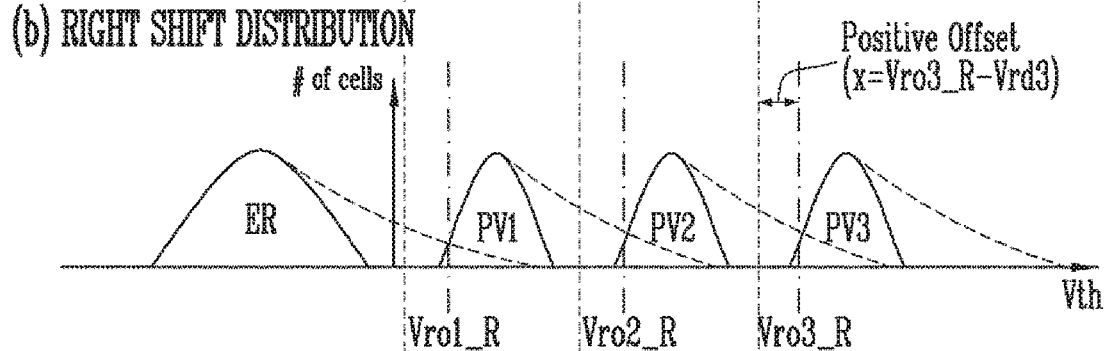
(b) RIGHT SHIFT DISTRIBUTION
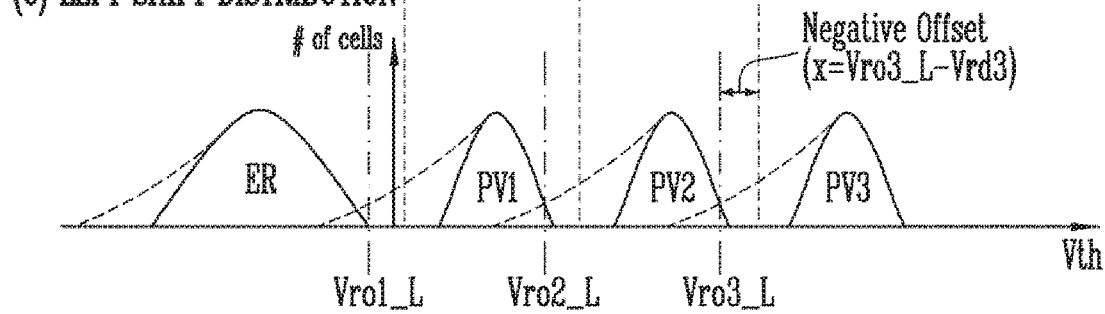
(c) LEFT SHIFT DISTRIBUTION

WORKLOAD TABLE (211)

| REFERENCE INTERVAL (OFFSET, x=Vro-Vrd) | WORKLOAD STATE |
|---|---|
| $0 < x < Ref\_1$ | Default |
| $Ref\_1 \leq x < Ref\_2$ | RI_1 |
| $Ref\_2 \leq x < Ref\_3$ | RI_2 |
| $Ref\_3 \leq x < Ref\_4$ | RI_3 |

FIG. 8
OPERATING ENVIRONMENT SETTING TABLE (222)
| FINAL WORKLOAD STATE | BUFFER CONTROL INFORMATION | COMMAND QUEUE CONTROL INFORMATION |
|---|---|---|
| RI_1 | Buffer_CI1 | CMD queue_CI1 |
| RI_2 | Buffer_CI2 | CMD queue_CI2 |
| RI_3 | Buffer_CI3 | CMD queue_CI3 |
| RI_4 | Buffer_CI4 | CMD queue_CI4 |
| RI_5 | Buffer_CI5 | CMD queue_CI5 |
FIG. 9
(a) Default
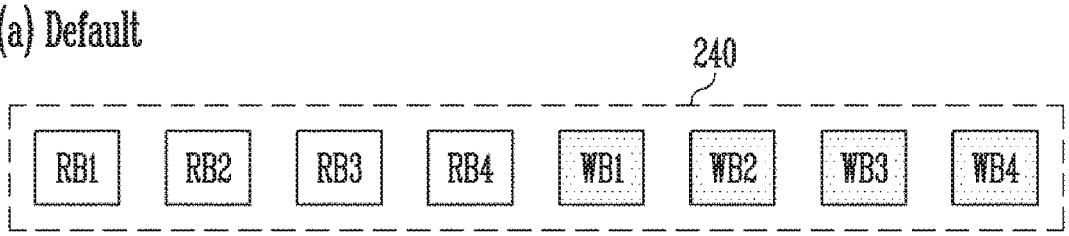
(b) Read Intensive_1
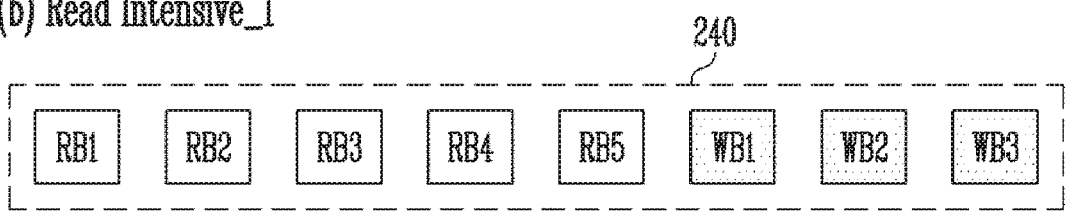
(c) Read Intensive_2
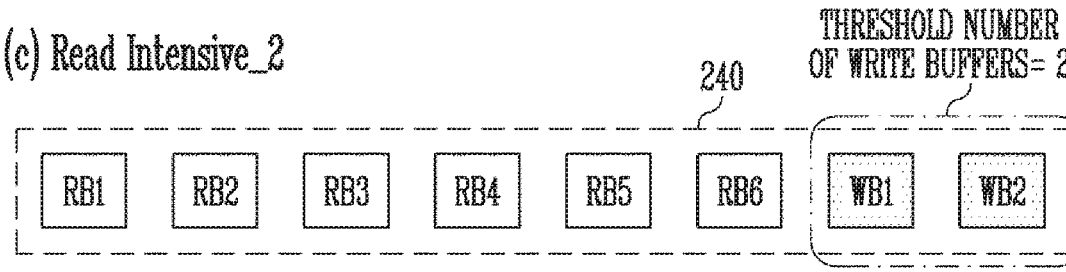

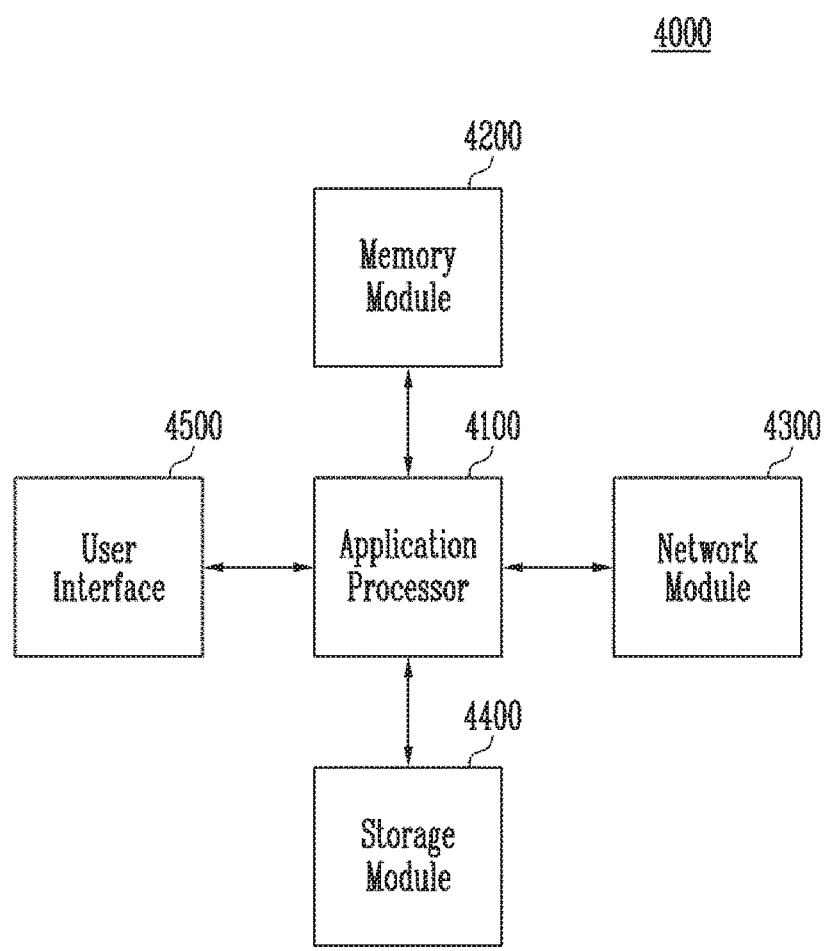

US 11,204,698 B2

MEMORY CONTROLLER TO SET OPERATING ENVIRONMENT OF MEMORY DEVICE, METHOD OF OPERATING THE SAME AND STORAGE DEVICE INCLUDING THE SAME

CROSS-REFERENCE TO RELATED APPLICATION

The present application claims priority under 35 U.S.C. § 119(a) to Korean patent application number 10-2018-0159496, filed on Dec. 11, 2018, which is incorporated herein by reference in its entirety.

BACKGROUND

Field of Invention

Various embodiments of the present disclosure generally relate to an electronic device, and more particularly, to a storage device and a method of operating the storage device.

Description of Related Art

A storage device stores data under the control of a host device, such as a computer or a smartphone. The storage device may include a memory device in which data is stored and a memory controller which controls the memory device. Such memory device may be a volatile memory device or a nonvolatile memory device.

A volatile memory device stores data only when power is supplied; stored data is lost when the supply of power is interrupted. Examples of a volatile memory device include a Static Random Access Memory (SRAM) and a Dynamic Random Access Memory (DRAM).

A nonvolatile memory device retains stored data even when the supply of power is interrupted. Examples of a nonvolatile memory device include a Read Only Memory (ROM), a Programmable ROM (PROM), an Electrically Programmable ROM (EPROM), an Electrically Erasable and Programmable ROM (EEPROM), and a flash memory.

SUMMARY

Various embodiments of the present disclosure are directed to a storage device, which provides firmware optimized for a user's working environment, and a method of operating the storage device.

An embodiment of the present disclosure may provide for a memory controller for controlling a memory device that includes a plurality of memory cells, the memory controller comprising: a workload determination circuit configured to determine a workload state indicating an operating pattern of the memory device based on optimal read voltages for reading the plurality of memory cells when a read operation performed on the memory cells fails; and an operating environment setting circuit configured to set an operating environment of the memory device based on the workload state.

An embodiment of the present disclosure may provide for a method of operating a memory controller for controlling a memory device that includes a plurality of memory cells, the method comprising: setting optimal read voltages for reading the plurality of memory cells when a read operation performed on the memory cells fails; determining a workload state indicating an operating pattern of the memory device based on the optimal read voltages; and setting an operating environment of the memory device based on the workload state.

An embodiment of the present disclosure may provide for a storage device. The storage device may include a memory device including a plurality of memory cells and configured to perform a read operation on the plurality of memory cells; and a memory controller configured to determine a workload state indicating an operating pattern of the memory device based on optimal read voltages for reading the plurality of memory cells when the read operation fails, and configured to set an operating environment of the memory device based on the workload state.

An embodiment of the present disclosure may provide for a storage device. The storage device may include a memory device configured to perform a read operation with reference read voltages; and a memory controller that includes plural buffers and a command queue, and is configured to perform, when the read operation is performed more than a set number of times during a set period, at least one of a first and a second operation based on difference between a default reference read voltage and a last reference read voltage, wherein the first operation is an operation of adjusting assignment of the buffers as read buffers and write buffers, wherein the second operation is an operation of adjusting an order of commands queued in the command queue to prioritize a read command among the queued commands, and wherein the last reference read voltage is used in a last-performed read operation.

BRIEF DESCRIPTION OF THE DRAWINGS

FIG. 2 is a diagram illustrating a change in the threshold voltage distribution of memory cells and optimal read voltages.

FIG. 8 is a diagram for explaining an operating environment setting table for storing buffer control information and command queue control information depending on a final workload state.

FIG. 9 is a diagram for explaining adjustment of the number of write buffers and read buffers in accordance with an embodiment of the present disclosure.

FIG. 19 is a block diagram illustrating a user system to which a storage device is applied in accordance with an embodiment of the present disclosure.

DETAILED DESCRIPTION

Figure 1:
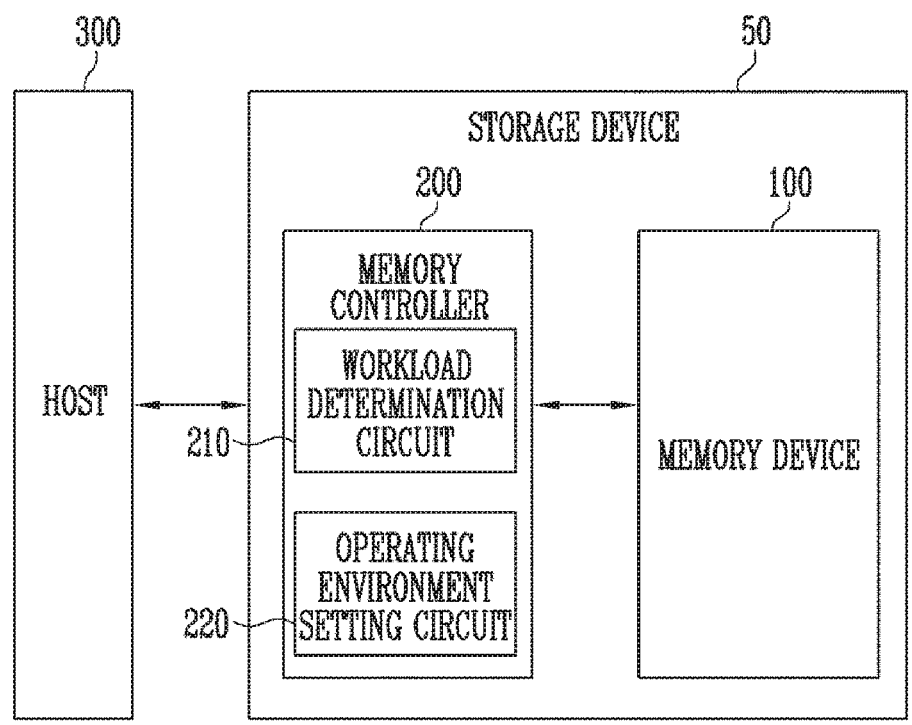
FIG. 1 is a diagram illustrating a storage device in accordance with an embodiment of the present disclosure.

Specific structural and functional description presented herein is directed to embodiments of the present disclosure. The present invention, however, is not limited to either the specific description provided or any of the embodiments described herein.

While various embodiments are described in detail, the present invention is not limited to any particular embodiment(s). Rather, the present invention encompasses all modifications, equivalents, alternatives and substitutes that do not depart from the spirit and technical scope of the present disclosure.

It will be understood that, although the terms "first" and/or "second" may be used herein to identify various elements, these elements should not be limited by these terms. These terms are only used to distinguish one element from another element that otherwise have the same or similar names. For example, a first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art is omitted to avoid obscuring the subject matter of the present disclosure. This aims to make the subject matter of the present disclosure clear.

Various embodiments of the present disclosure are described more fully below with reference to the accompanying drawings, in which preferred embodiments of the present disclosure are illustrated, so that those skilled in the art are able to practice the present invention. Throughout the specification, reference to "an embodiment," "another embodiment" or the like is not necessarily to only one embodiment, and different references to any such phrase are not necessarily to the same embodiment(s).

FIG. 1 is a diagram illustrating a storage device in accordance with an embodiment of the present disclosure.

Referring to FIG. 1, a storage device 50 may include a memory device 100 and a memory controller 200. The storage device 50 may store data under the control of a host 300, such as a mobile phone, a smartphone, an MP3 player, a laptop computer, a desktop computer, a game console, a television (TV), a tablet personal computer (PC), or an in-vehicle infotainment system.

The storage device 50 may be configured as any of various types of storage devices depending on a host interface that is a scheme for communication with the host 300. For example, the storage device 50 may be implemented as a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-e or PCIe) card-type storage device, a compact flash (CF) card, a smart media card, and/or a memory stick.

The storage device 50 may be manufactured in any of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, features and aspects of the present invention are described in the context in which the memory device 100 is a NAND flash memory.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

The memory controller 200 controls overall operation of the storage device 50.

When power is applied to the storage device 50, the memory controller 200 may run firmware (FW). When the memory device 100 is a flash memory device, the memory controller 200 may run firmware such as a flash translation layer (FTL) for controlling communication between the host 300 and the memory device 100.

In an embodiment, the memory controller 200 may receive data and a logical block address (LBA) from the host 300, and may translate the logical block address into a physical block address (PBA) indicating the address of memory cells in the memory device 100 where data is to be stored.

The memory controller 200 may control the memory device 100 so that a program operation, a read operation or an erase operation is performed in response to a request received from the host 300. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a program command, an address, and data regardless of a request from the host 300, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 based on an interleaving scheme to improve operating performance. The interleaving scheme may be an operating method in which multiple memory devices 100 are operated in overlapping periods of time.

In an embodiment, the memory controller 200 may include a workload determination circuit 210 and an operating environment setting circuit 220.

The workload determination circuit 210 may determine a workload state indicating the operating pattern of the memory device 100 using an optimal read voltage. The optimal read voltage may be set so as to read memory cells when reading memory cells using a default read voltage fails. The workload state may indicate whether a current operating pattern includes performance of more read operations than in a default operating pattern.

The workload determination circuit 210 may determine the workload state using an offset which is a difference between the optimal read voltage and the default read voltage. As the offset becomes larger, the workload state may indicate an operating pattern in which more read operations are performed.

The workload determination circuit 210 may save a sample workload state whenever a read operation on the memory cells fails. The sample workload state may be a workload state that is determined based on an offset used when the read operation fails.

The workload determination circuit 210 may determine a final workload state when the number of sample workload states that are saved is equal to or greater than a reference number. The final workload state may be a sample workload state corresponding to the largest offset, among the plurality of saved sample workload states. The workload determination circuit 210 may provide the final workload state to the operating environment setting circuit 220. After providing the final workload state, the workload determination circuit 210 may delete the plurality of saved sample workload states.

The operating environment setting circuit 220 may set the operating environment of the memory device based on the final workload state.

In an embodiment, the operating environment setting circuit 220 may adjust the number of read buffers and write buffers included in a buffer group based on the final workload state. The operating environment setting circuit 220 may increase the number of read buffers depending on the final workload state. The operating environment setting circuit 220 may decrease the number of write buffers by the same number by which the read buffers are increased. The operating environment setting circuit 220 may decrease the number of write buffers until the number of write buffers reaches a threshold number of write buffers. The threshold number of write buffers may be the minimum number of write buffers required for a write operation of the memory device.

In other embodiments, the operating environment setting circuit 220 may change a sequence in which commands sequentially queued in a command queue are to be output to the memory device. The commands in the command queue may be output to the memory device in a sequence in which the commands are queued. When the queueing order of the commands is changed, the output order according to which the commands are to be output to the memory device may also be changed.

The operating environment setting circuit 220 may change the queueing order of commands queued in the command queue so that a read command is output to the memory device earlier than a write command based on the final workload state. The read command may be originally queued later than the write command. In detail, the operating environment setting circuit 220 may change the queueing order of commands in the command queue so that at least one of read commands in the command queue is output prior to a write command. The write command was originally queued in the command queue earlier or at a higher sequential position than the at least one read command.

In an embodiment, the operating environment setting circuit 220 may be configured to, when the number of write buffers adjusted depending on the final workload state reaches the threshold number of write buffers, change the queueing order of the commands in the command queue to change output order of the queued command.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

FIG. 2 is a diagram illustrating a change in the threshold voltage distribution of memory cells and optimal read voltages.

Referring to FIG. 2, a memory cell indicates a multi-level cell (MLC) in which one memory cell stores two data bits. The multi-level cell may have a state corresponding to an erased state E or any one of first to third programmed states PV1 to PV3.

Graph (a) shows a multi-level cell having a normal threshold voltage distribution. In the case of a multi-level cell having a normal threshold voltage distribution, a sufficient margin may be secured between threshold voltage distributions corresponding to respective states. A read margin may be an interval between threshold voltage distributions at which read voltages can be disposed so as to distinguish adjacent states from each other.

In graph (a), first to third default read voltages Vrd1 to Vrd3 may be read voltages for distinguishing the erased state E and the first to third programmed states PV1 to PV3 from each other. The first default read voltage Vrd1 may be for distinguishing the erased state E from the first programmed state PV1. The second default read voltage Vrd2 may be for distinguishing the first programmed state PV1 from the second programmed state PV2. The third default read voltage Vrd3 may be for distinguishing the second programmed state PV2 from the third programmed state PV3.

Graph (b) shows a distribution in which a right edge of the threshold voltage distribution of the multi-level cell is extended and shifted to the right compared to a normal threshold voltage distribution due to various factors such as program disturb or read disturb. In this case, a sufficient read margin may not be secured between threshold voltage distributions corresponding to respective states.

When the multi-level cell is read using the first to third default read voltages Vrd1 to Vrd3, described with reference to graph (a), the number of error bits included in the read data may increase, and thus the probability that the read operation will fail may increase.

Whether the read operation has passed or failed may be determined depending on whether error correction decoding performed on data that is read using read voltages has passed or failed. When the error correction decoding has passed, the read operation may pass. When the error correction decoding has failed, the read operation may fail.

Whether error correction decoding has passed or failed may be determined based on the result of a comparison between the number of error bits in the data that is read and the number of bits correctable by an error correction decoder. When the number of error bits in the read data is less than or equal to the number of bits correctable by the error correction decoder, error correction decoding may pass. When the number of error bits in the read data is greater than the number of bits correctable by the error correction decoder, error correction decoding may fail.

The number of error bits denotes the number of memory cells that are to be read as ON cells, but are read as OFF cells or the number of memory cells that are to be read as OFF cells, but are read as ON cells depending on the programmed states of the memory cells. The number of correctable bits denotes the number of error bits that can be restored to original bits by the error correction decoder.

Therefore, in order to reduce the probability that the read operation will fail, the levels of read voltages for reading the multi-level cell may be adjusted by an offset with respect to the default read voltage. The offset may be a voltage to be added or subtracted so as to change the read voltages due to various causes.

In an embodiment, first to third optimal read voltages Vro1_R to Vro3_R may be adjusted by a positive offset with respect to the first to third default read voltages Vrd1 to Vrd3, described above with reference to graph (a).

When memory cells having a threshold voltage distribution, the right edge of which is extended and shifted to the right compared to a normal threshold voltage distribution, are read using the first to third optimal read voltages Vro1_R to Vro3_R, the number of error bits may be decreased, and thus the probability that the read operation will fail may be reduced.

Graph (c) shows a distribution in which a left edge of the threshold voltage distribution of the multi-level cell is extended and shifted to the left compared to a normal threshold voltage distribution due to various factors such as the retention of memory cells. In this case, a sufficient read margin may not be secured between threshold voltage distributions corresponding to respective states.

When the multi-level cell is read using the first to third default read voltages Vrd1 to Vrd3, described with reference to graph (a), the number of error bits in the read data may increase, and thus the probability that the read operation will fail may increase.

In an embodiment, first to third optimal read voltages Vro1_L to Vro3_L may be adjusted by a negative offset with respect to the first to third default read voltages Vrd1 to Vrd3, described above with reference to graph (a).

When memory cells having a threshold voltage distribution, the left edge of which is extended and shifted to the left compared to a normal threshold voltage distribution, are read using the first to third optimal read voltages Vro1_L to Vro3_L, the number of error bits may be decreased, and thus the probability that the read operation will fail may be reduced.

Figure 3:
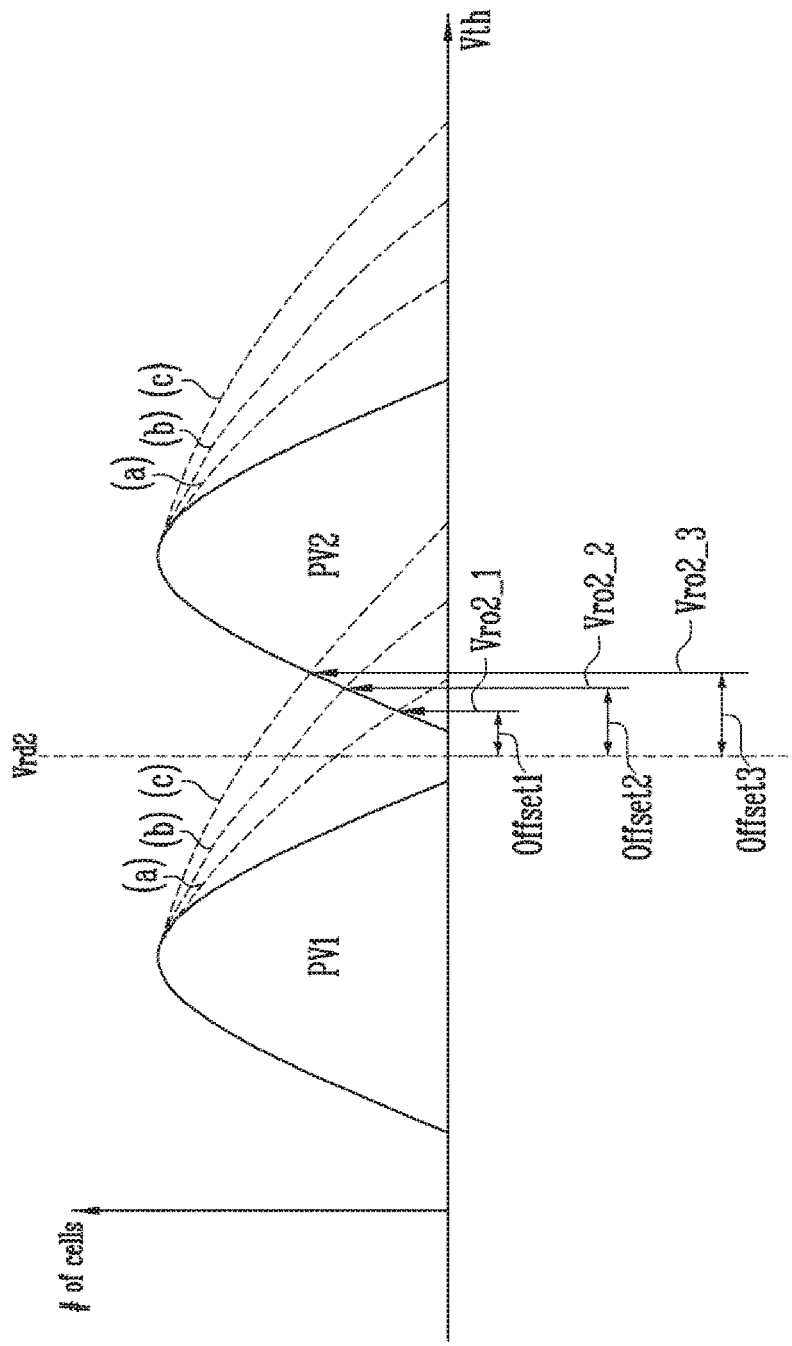
FIG. 3 is a diagram illustrating offsets between optimal read voltages and a default read voltage.

FIG. 3 is a diagram illustrating offsets that are differences between optimal read voltages and a default read voltage.

Referring to FIG. 3, a horizontal axis denotes a threshold voltage and a vertical axis denotes the number of memory cells.

In FIG. 3, the memory cells have a state corresponding to any one of a first programmed state PV1 and a second programmed state PV2. A default read voltage Vrd2 may be set to distinguish the first programmed state PV1 from the second programmed state PV2.

The right edge of the threshold voltage distribution of memory cells may be extended and shifted to the right due to various factors, such as program disturb or read disturb. In an embodiment, a width at which the right edge of the threshold voltage distribution of memory cells is extended and shifted to the right may increase in the sequence of graphs (a), (b) and (c).

In an embodiment, a first optimal read voltage Vro2_1 may be for distinguishing the first programmed state PV1 from the second programmed state PV2 when the right edge of the threshold voltage distribution corresponding to the first programmed state PV1 is extended and shifted, as shown in graph (a). Here, the first optimal read voltage Vro2_1 may be a voltage at a point at which the threshold voltage distribution, which corresponds to the first programmed state PV1 and the right edge of which is shown in graph (a), and the threshold voltage distribution, which corresponds to the second programmed state PV2, intersect.

A second optimal read voltage Vro2_2 may be for distinguishing the first programmed state PV1 from the second programmed state PV2 when the right edge of the threshold voltage distribution corresponding to the first programmed state PV1 is extended and shifted, as shown in graph (b). Here, the second optimal read voltage Vro2_2 may be a voltage at a point at which the threshold voltage distribution, which corresponds to the first programmed state PV1 and the right edge of which is shown in graph (b), and the threshold voltage distribution, which corresponds to the second programmed state PV2, intersect.

A third optimal read voltage Vro2_3 may be for distinguishing the first programmed state PV1 from the second programmed state PV2 when the right edge of the threshold voltage distribution corresponding to the first programmed state PV1 is extended and shifted, as shown in graph (c). Here, the third optimal read voltage Vro2_3 may be a voltage at a point at which the threshold voltage distribution, which corresponds to the first programmed state PV1 and the right edge of which is shown in graph (c), and the threshold voltage distribution, which corresponds to the second programmed state PV2, intersect.

The offsets may be differences between the default read voltage and the optimal read voltages. When the optimal read voltage is greater than the default read voltage, the corresponding offset may have a positive value. As the width at which the right edge of the threshold voltage distribution of memory cells is extended and shifted to the right is increased, the magnitude of the optimal read voltage may be increased. As the magnitude of the optimal read voltage is increased, the magnitude of the corresponding offset may be increased.

In an embodiment, a first offset Offset1 may be a value obtained by subtracting the default read voltage Vrd2 from the first optimal read voltage Vro2_1. A second offset Offset2 may be a value obtained by subtracting the default read voltage Vrd2 from the second optimal read voltage Vro2_2. A third offset Offset3 may be a value obtained by subtracting the default read voltage Vrd2 from the third optimal read voltage Vro2_3. Offset3 may be greater than Offset2 which may be greater than Offset1.

Figures 4, 5:
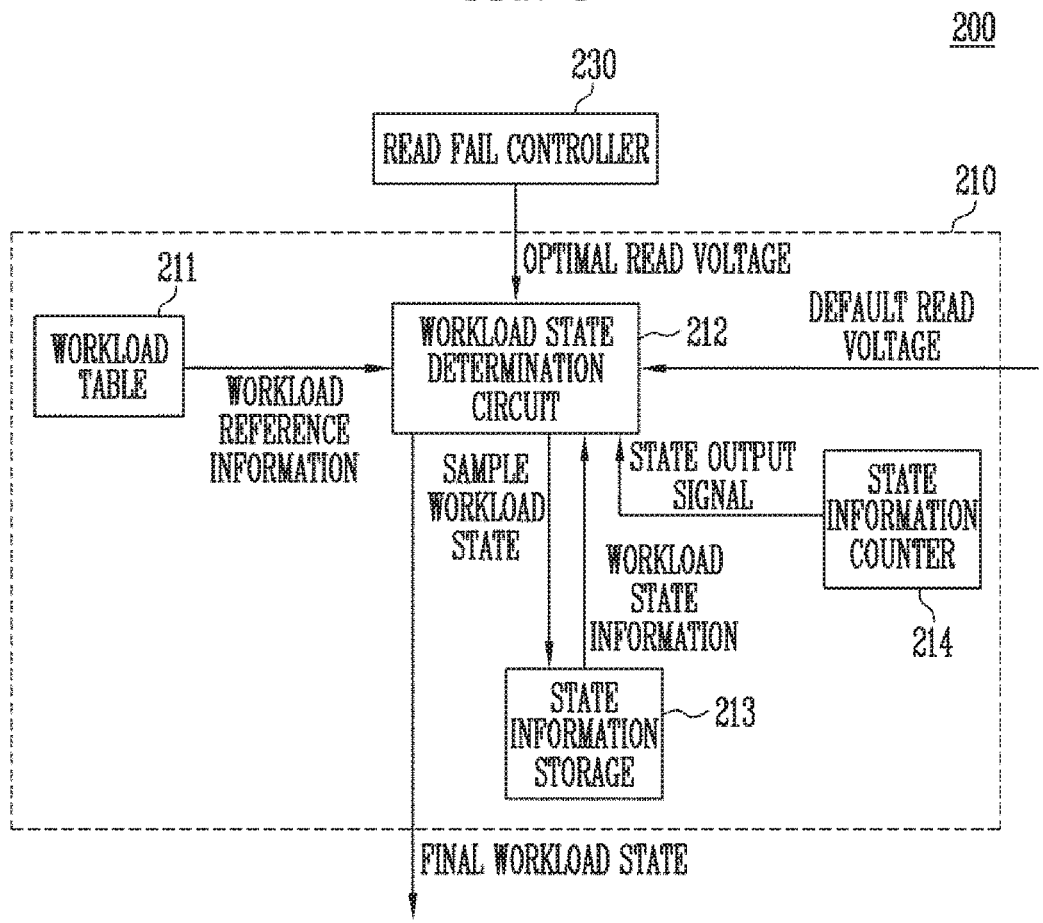
FIG. 4 is a diagram illustrating operation of a memory controller for determining a workload state.
FIG. 5 is a diagram illustrating a workload table for storing workload reference information indicating workload states determined depending on offsets.

FIG. 4 is a diagram illustrating operation of a memory controller for determining a workload state.

Referring to FIG. 4, the memory controller 200 may further include a read fail controller 230.

In an embodiment, the workload determination circuit 210 may include a workload table 211, a workload state determination circuit 212, a state information storage 213, and a state information counter 214.

The workload table 211 may store workload reference information including workload states that are determined based on the results of comparisons between an offset and a plurality of workload reference values. The workload states may be the operating patterns of a memory device. In detail, the workload state may indicate whether a current operating pattern is an operating pattern in which more read operations than those in a default operating pattern of the memory device are performed.

The offset may be a difference between an optimal read voltage and a default read voltage. The optimal read voltage may be a read voltage that is set to read memory cells when reading the memory cells using the default read voltage fails. As the offset is larger, the workload state may indicate an operating pattern in which more read operations are performed.

The workload state determination circuit 212 may calculate the offset between the optimal read voltage provided by the read fail controller 230 and the default read voltage. The optimal read voltage may be provided from the read fail controller 230 whenever the operation of reading memory cells using the default read voltage fails.

The workload state determination circuit 212 may save a plurality of sample workload states in the state information storage 213. The sample workload states may be workload states determined based on the offsets and workload reference information. The workload state determination circuit 212 may not save a sample workload state representing a default state in the state information storage 213.

The workload state determination circuit 212 may determine a final workload state in response to a state output signal provided by the state information counter 214. The final workload state may be a sample workload state corresponding to the largest offset, among a plurality of sample workload states saved in the state information storage 213. The workload state determination circuit 212 may provide the final workload state to an operating environment setting circuit 220, described above with reference to FIG. 1, in response to the state output signal. When the final workload state is provided to the operating environment setting circuit 220, the workload state determination circuit 212 may delete workload state information including the plurality of sample workload states saved in the state information storage 213.

The state information storage 213 may store the workload state information including the plurality of sample workload states. The state information storage 213 may receive the sample workload states from the workload state determination circuit 212 and save the sample workload states. The state information storage 213 may delete the workload state information under the control of the workload state determination circuit 212.

The state information counter 214 may count the number of sample workload states saved in the state information storage 213. When the number of stored sample workload states is equal to or greater than a reference number, the state information counter 214 may generate the state output signal and provide the state output signal to the workload state determination circuit 212.

The read fail controller 230 may set an optimal read voltage for reading memory cells when an operation of reading memory cells using the default read voltage fails. The read fail controller 230 may provide set optimal read voltages to the workload state determination circuit 212 whenever the operation of reading memory cells fails.

FIG. 5 is a diagram illustrating a workload table for storing the workload reference information indicating workload states determined depending on offsets.

Referring to FIG. 5, the workload reference information may include a plurality of workload reference values. The workload reference information may indicate workload states corresponding, respectively, to a plurality of reference intervals. The plurality of reference intervals are determined based on the plurality of workload reference values. The offset x may be a difference between an optimal read voltage Vro and a default read voltage Vrd.

In FIG. 5, the workload reference information may include first to fourth workload reference values Ref_1 to Ref_4. There are four (4) possible workload states: a default state and first to third read intensive states RI_1 to RI_3. Each read intensive state may indicate an operating pattern in which more read operations than those in a default operating pattern of a memory device are performed. Moreover, a higher numbered read intensive state may indicate an operating pattern in which more read operations than those in an operating pattern corresponding to a lower numbered read intensive state. The number of workload reference values in the workload reference information and the number of read intensive states are not limited to those described in the present embodiment.

A workload state may be determined depending on a reference interval to which the offset belongs, among the plurality of reference intervals determined based on the first to fourth workload reference values Ref_1 to Ref_4.

For example, when the offset x is greater than 0 and is less than the first workload reference value Ref_1, the workload state may be a default state. When the offset x is equal to or greater than the first workload reference value Ref_1 and is less than the second workload reference value Ref_2, the workload state may be a first read intensive state RI_1. When the offset x is equal to or greater than the second workload reference value Ref_2 and is less than the third workload reference value Ref_3, the workload state may be a second read intensive state RI_2. When the offset x is equal to or greater than the third workload reference value Ref_3 and is less than the fourth workload reference value Ref_4, the workload state may be a third read intensive state RI_3.

In an embodiment, when the workload state is the first read intensive state RI_1, the operating pattern of the memory device may be a pattern in which more read operations than those in a case where the workload state is the default state are performed. When the workload state is the second read intensive state RI_2, the operating pattern of the memory device may be a pattern in which more read operations than those in a case where the workload state is the first read intensive state RI_1 are performed. When the workload state is the third read intensive state RI_3, the operating pattern of the memory device may be a pattern in which more read operations than those in a case where the workload state is the second read intensive state RI_2 are performed.

Figure 6:
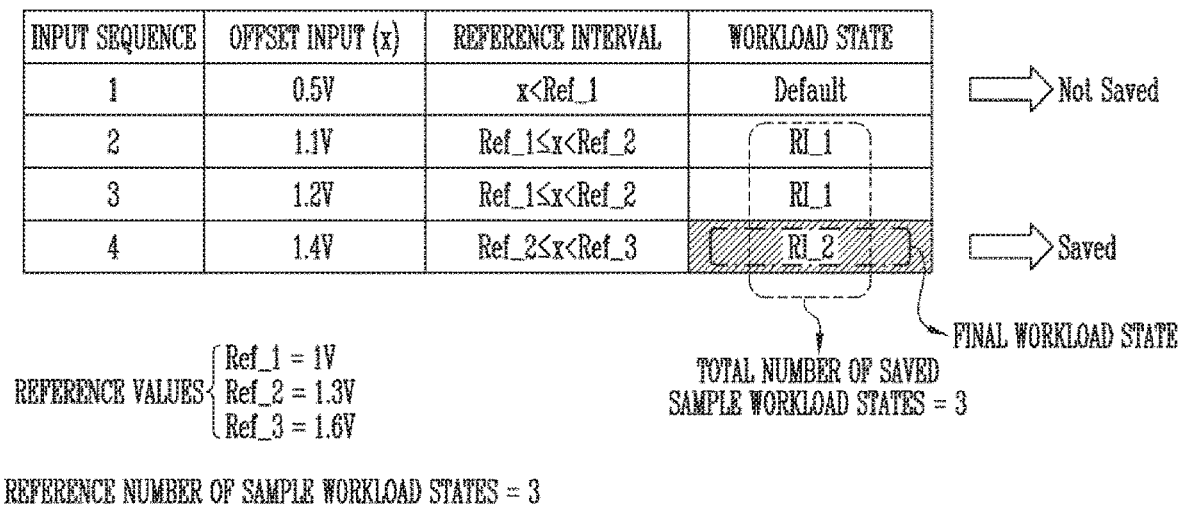
FIG. 6 is a diagram illustrating an embodiment for determining a final workload state.

FIG. 6 is a diagram illustrating an embodiment for determining a final workload state.

Referring to FIG. 6, the final workload state may be determined based on an input offset and workload reference information, described above with reference to FIG. 5.

In FIG. 6, first to fourth offsets may be input. The workload reference information may include first to third workload reference values Ref_1 to Ref_3. The first workload reference value Ref_1 may be 1. The second workload reference value Ref_2 may be 1.3. The third workload reference value Ref_3 may be 1.6. The reference number of sample workload states may be 3. The number of input offsets, the number of workload reference values, and the reference number of sample workload states are not limited to the present embodiment.

The first offset may be 0.5. Therefore, since the first offset is less than the first workload reference value Ref_1, the workload state may be a default state. The second offset may be 1.1. Since the second offset is equal to or greater than the first workload reference value Ref_1 and is less than the second workload reference value Ref_2, the workload state may be a first read intensive state RI_1. The third offset may be 1.2. Since the third offset is equal to or greater than the first workload reference value Ref_1 and is less than the second workload reference value Ref_2, the workload state may be the first read intensive state RI_1. The fourth offset may be 1.4. Since the fourth offset is equal to or greater than the second workload reference value Ref_2 and is less than the third workload reference value Ref_3, the workload state may be a second read intensive state RI_2.

The state information storage 213, described above with reference to FIG. 4, may save sample workload states determined for the input offsets, but may not save a sample workload state in which the workload state is the default state.

For example, since the workload state determined for the first offset is the default state, it may not be saved in the state information storage 213. Since none of the workload states determined based on the second to fourth offsets is a default state, those workload states may be saved in the state information storage 213.

When the number of sample workload states saved in the state information storage 213 is equal to or greater than the reference number of sample workload states, the final workload state may be determined. The final workload state may be a sample workload state corresponding to the largest offset, among the saved sample workload states.

For example, among the second to fourth offsets, the fourth offset is 1.4, which the largest value, and thus the sample workload state corresponding to the fourth offset may be determined to be the final workload state. Here, the final workload state may be the second read intensive state RI_2.

Figure 7:
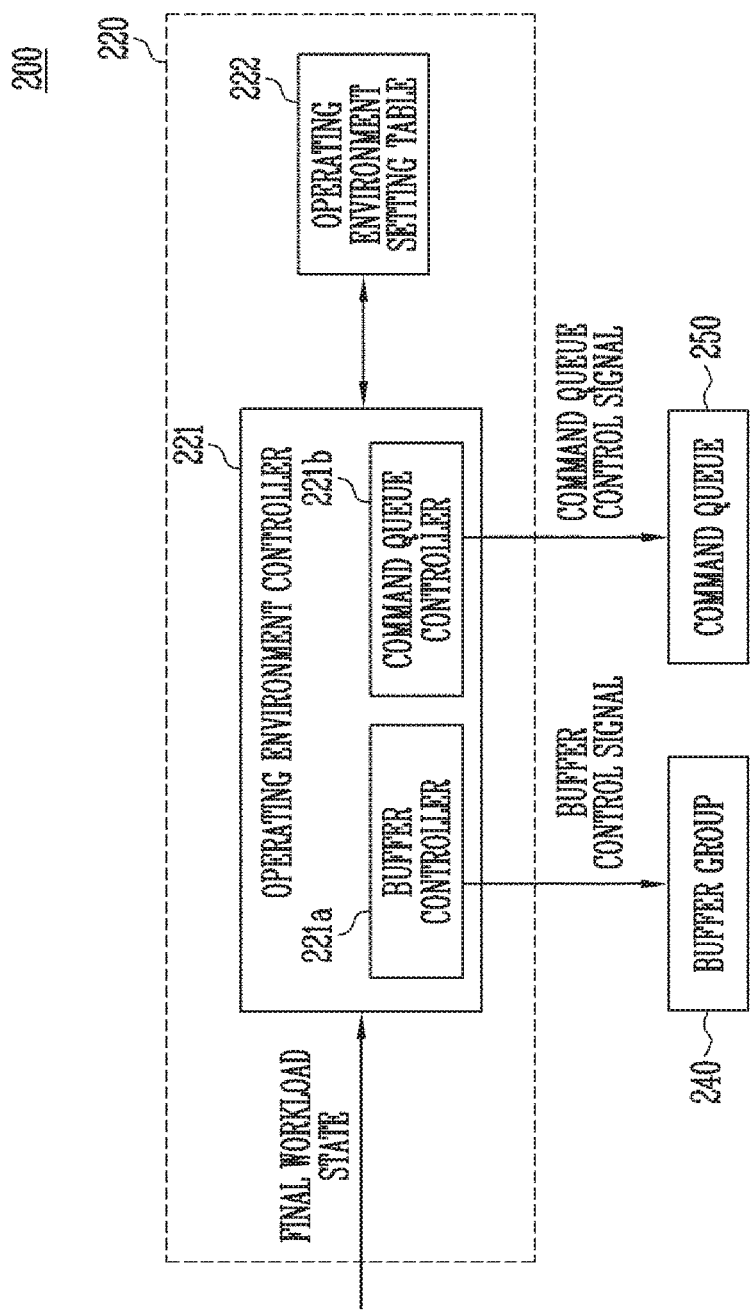
FIG. 7 is a diagram illustrating operation of a memory controller for controlling an operating environment.

FIG. 7 is a diagram illustrating the operation of a memory controller, e.g., memory controller 200, for controlling an operating environment.

Referring to FIG. 7, the memory controller 200 may further include a buffer group 240, and a command queue 250, in addition to the operating environment setting circuit 220.

In an embodiment, the operating environment setting circuit 220 may include an operating environment controller 221 and an operating environment setting table 222.

The operating environment controller 221 may receive the final workload state from the workload state determination circuit 212, described with reference to FIG. 4. The operating environment controller 221 may control the buffer group 240 using buffer control information stored in the operating environment setting table 222 based on the received final workload state. The operating environment controller 221 may control the command queue 250 using command queue control information stored in the operating environment setting table 222 based on the received final workload state.

The operating environment controller 221 may include a buffer controller 221a and a command queue controller 221b.

The buffer controller 221a may adjust the number of read buffers and write buffers included in the buffer group 240 in response to a buffer control signal. The buffer control signal may be determined based on the final workload state and buffer control information.

In an embodiment, the buffer controller 221a may set a write buffer to a read buffer in response to the buffer control signal. In this case, the number of read buffers included in the buffer group 240 may be increased, and the number of write buffers included in the buffer group 240 may be decreased. In an embodiment, the buffer controller 221a may set a read buffer to a write buffer in response to the buffer control signal. In this case, the number of write buffers included in the buffer group 240 may be increased, and the number of read buffers may be decreased.

That is, the buffer controller 221a may increase the number of read buffers included in the buffer group 240 in response to the buffer control signal based on the final workload state. The buffer controller 221a may decrease the number of write buffers included in the buffer group 240 in response to the buffer control signal based on the final workload state. The buffer controller 221a may decrease the number of write buffers until the number of write buffers reaches a threshold number of write buffers, which may be the minimum number of write buffers required for a write operation of a memory device.

The command queue controller 221b may change the queueing order of commands in the command queue 250 to change the output order of the queued commands in response to a command queue control signal. The command queue control signal may be determined based on the final workload state and command queue control information.

The command queue controller 221b may change the queueing order of commands in the command queue 250 so that a read command is output to the memory device prior to a write command based on the final workload state. The read command may be originally queued in the command queue 250 later than the write command.

In detail, the command queue controller 221b may change the queueing order of commands in the command queue 250 so that at least one of read commands queued in the command queue 250 is output prior to a write command originally queued prior to, or earlier than, the at least one read command.

In an embodiment, the command queue controller 221b may be configured to change the queuing order of commands in the command queue 250, when the number of write buffers adjusted by the buffer controller 221a depending on the final workload state reaches the threshold number of write buffers. The original queuing order of commands may be the sequential order in which they are received or stored in the command queue 250.

The operating environment setting table 222 may store the buffer control information and the command queue control information. The buffer control information may pertain to the adjustment to the number of read buffers or write buffers in the buffer group 240. The command queue control information may pertain to the order in which the commands are queued in the command queue 250, which is also indicative of the order in which such commands are to be output to the memory device.

The buffer group 240 may include a plurality of read buffers and a plurality of write buffers. Each of the read buffers may include a plurality of latch circuits for storing data. In order to output data read from the memory device, described above with reference to FIG. 1, to the host, each read buffer may temporarily store the read data. Each of the write buffers may include a plurality of latch circuits for storing data. In order to store data, received from the host, in the memory device, each write buffer may temporarily store the received data.

The command queue 250 may queue sequentially received commands. The command queue 250 may output the commands, which are sequentially received and stored, to the memory device in the sequence of the queued commands until the queued order changes as explained herein. When the queued order of the commands changes, the order in which the commands are to be output to the memory device may also be changed.

FIG. 8 is a diagram for explaining an operating environment setting table for storing buffer control information and command queue control information depending on a final workload state.

Referring to FIG. 8, buffer control information Buffer_CI may indicate the adjustment of the number of read buffers or write buffers included in a buffer group. Command queue control information CMD queue_CI may indicate an order or a sequence in which commands in a command queue are to be output to a memory device.

In FIG. 8, when a final workload state is a first read intensive state RI_1, the buffer control information may be first buffer control information Buffer_CI1. When the final workload state is the first read intensive state RI_1, the command queue control information may be first command queue control information CMD queue_CI1.

Similarly, when the final workload state indicates second to fifth read intensive states RI_2 to RI_5, the buffer control information may be second to fifth buffer control information Buffer_CI2 to Buffer_CI5 respectively. When the final workload state indicates the second to fifth read intensive states RI_2 to RI_5, the command queue control information may be second to fifth command queue control information CMD queue_CI2 to CMD queue_CI5 respectively.

The number of read buffers or write buffers included in the buffer group may be adjusted based on the buffer control information that is determined based on the final workload state. Based on the command queue control information that is determined depending on the final workload state, the queueing order of the commands in the command queue may be changed.

For example, when the final workload state changes in a direction from the first read intensive state RI_1 to the fifth read intensive state RI_5, the operating pattern of the memory device may be a pattern in which more read operations are performed. Therefore, as the buffer control information changes in a direction from the first buffer control information Buffer_CI1 to the fifth buffer control information Buffer_CI5, the number of read buffers included in the buffer group may be further increased. The number of write buffers included in the buffer group may be further decreased. Similarly, as the command queue control information changes in a direction from the first command queue control information CMD queue_CI1 to the fifth command queue control information CMD queue_CI5, more read commands, among the commands in the command queue, may be output to the memory device prior to write commands that were originally queued prior to the read commands.

FIG. 9 is a diagram for explaining the adjustment of the number of write buffers and read buffers in accordance with an embodiment.

Referring to FIG. 9, a buffer group 240 may include a plurality of read buffers and a plurality of write buffers. In an embodiment, the buffer group 240 may include eight buffers. However, this is merely an example; any suitable number of buffers may be included in the buffer group 240.

As shown in part (a) of FIG. 9, when a final workload state is a default state, the buffer group 240 may include four (4) read buffers RB1 to RB4 and four (4) write buffers WB1 to WB4. More generally, when the final workload state is the default state, the buffer group 240 contains an initial set number of read buffers and an initial set number of write buffers, which is not limited to four. The initial set number of the read buffers and the initial set number of the write buffers may be respectively determined in a manufacturing process. The initial set numbers of the read buffers and the write buffers may be the same or different.

As shown in part (b) of FIG. 9, when the final workload state is a first read intensive state Read Intensive_1, the buffer group 240 may include five (5) read buffers RB1 to RB5 and three (3) write buffers WB1 to WB3.

As shown in part (c) of FIG. 9, when the final workload state is a second read intensive state Read Intensive_2, the buffer group 240 may include six (6) read buffers RB1 to RB6 and two (2) write buffers WB1 and WB2. Here, the threshold number of write buffers, which indicates the minimum number of write buffers required for the write operation of the memory device, may be 2.

That is, in the sequence of the final workload state corresponding to the default state, the first read intensive state Read Intensive_1, and the second read intensive state Read Intensive_2, the number of read buffers RB included in the buffer group 240 may be increased, and the number of write buffers WB included in the buffer group 240 may be decreased. However, the number of write buffers WB may not be decreased below the threshold number of write buffers.

Figure 10:
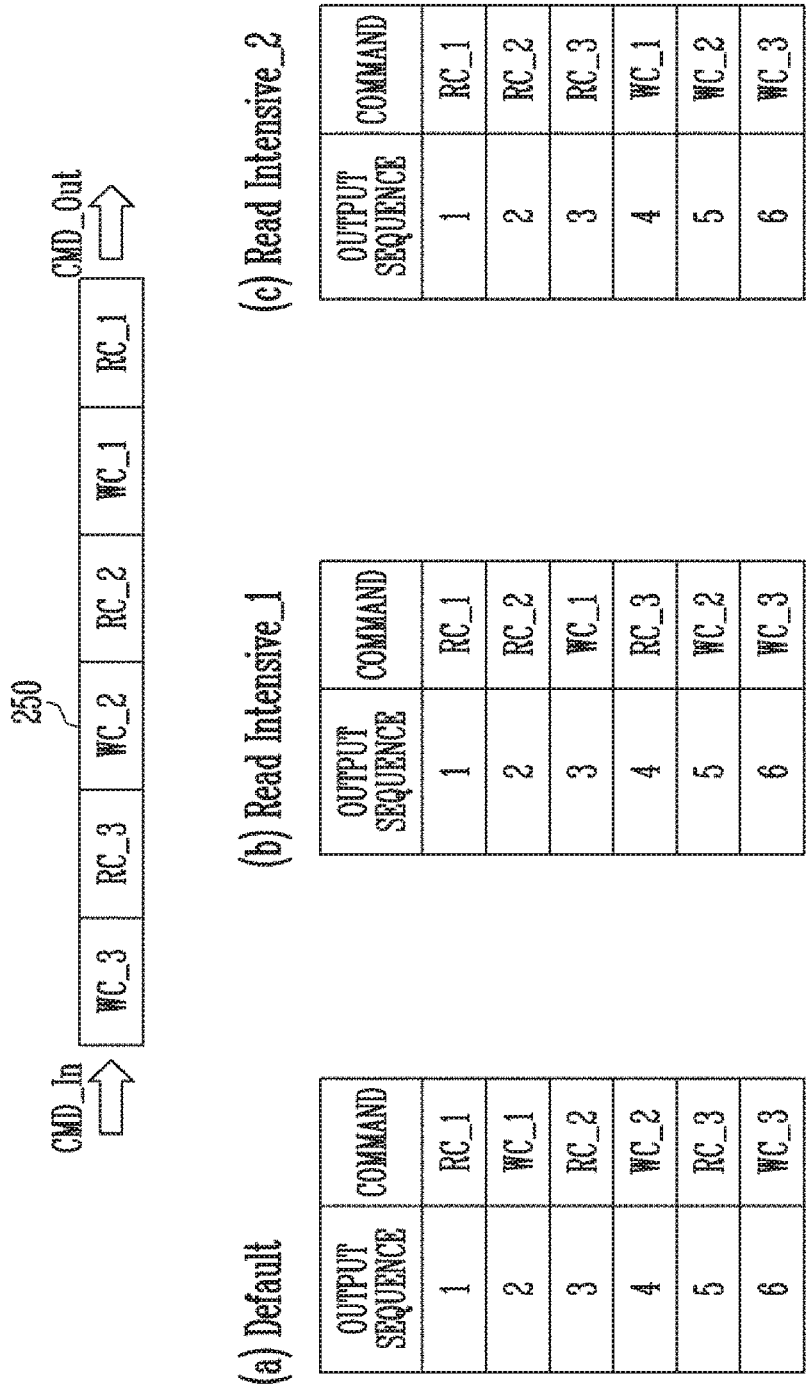
FIG. 10 is a diagram for explaining change of a sequence in which commands stored in a command queue are to be output to a memory device in accordance with an embodiment.

FIG. 10 is a diagram for explaining the change of the queueing order of commands in a command queue in accordance with an embodiment.

Referring to FIG. 10, the command queue 250 may queue commands that are sequentially input thereto. The command queue 250 may output the commands, which are sequentially received and stored, to the memory device according to the queueing order of the commands, which may be changed. When the queueing order of the commands in the command queue 250 are changed, the output order of the queued commands may also be changed. In the embodiment of FIG. 10, the command queue 250 stores six commands: three read commands and three write commands. However, the number and types of commands stored in the command queue 250 are not limited to this configuration.

In FIG. 10, the command queue 250 may sequentially receive and store a first read command RC_1, a first write command WC_1, a second read command RC_2, a second write command WC_2, a third read command RC_3, and a third write command WC_3. Therefore, the commands queued in the command queue 250 may be output to the memory device in the same order in which they were received and stored.

As shown in table (a) of FIG. 10, when a final workload state is a default state, the commands may be output from the command queue to the memory device in the order of the first read command RC_1, the first write command WC_1, the second read command RC_2, the second write command WC_2, the third read command RC_3, and the third write command WC_3.

As shown in table (b) of FIG. 10, when the final workload state is a first read intensive state Read Intensive_1, the commands may be output from the command queue to the memory device in the order of the first read command RC_1, the second read command RC_2, the first write command WC_1, the third read command RC_3, the second write command WC_2, and the third write command WC_3. That is, compared to the situation in which the final workload state is the default state (Table (a)), the second read command RC_2 may be output to the memory device prior to the first write command WC_1, and the third read command RC_3 may be output to the memory device prior to the second write command WC_2.

As shown in table (c) of FIG. 10, when the final workload state is a second read intensive state Read Intensive_2, the commands may be output from the command queue to the memory device in the order of the first read command RC_1, the second read command RC_2, the third read command RC_3, the first write command WC_1, the second write command WC_2, and the third write command WC_3. That is, compared to the situation in which he final workload state is the first read intensive state (Table (b)), the third read command RC_3 may be output to the memory device prior to the first write command WC_1.

That is, as the final workload state transitions in the direction of increased read intensiveness, the number of read commands output before write commands originally queued before the read commands increases.

Figure 11:
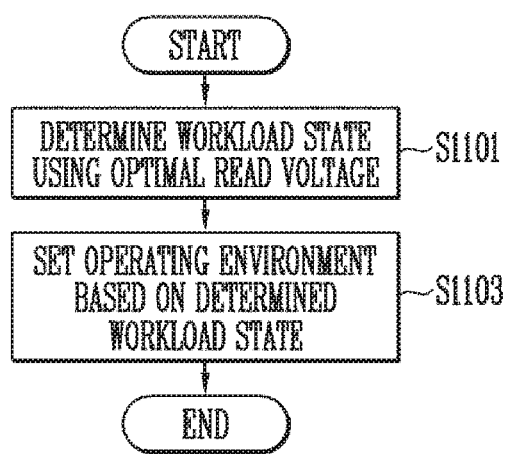
FIG. 11 is a flowchart illustrating overall operation of a memory controller in accordance with an embodiment of the present disclosure.

FIG. 11 is a flowchart illustrating the overall operation of a memory controller, e.g., memory controller 200, in accordance with an embodiment of the present disclosure.

Referring to FIG. 11, at step S1101, the memory controller may determine a workload state using an optimal read voltage. In detail, the memory controller may determine the workload state based on the results of comparisons between an offset, which is a difference between the optimal read voltage and a default read voltage, and workload reference values.

At step S1103, the memory controller may set an operating environment based on the determined workload state. In detail, the memory controller may adjust the number of read buffers and write buffers included in a buffer group based on the workload state. The memory controller may change an order in which commands are queued in a command queue based on the workload state, which order is indicative of the order in which the commands are to be output to the memory device.

Figure 12:
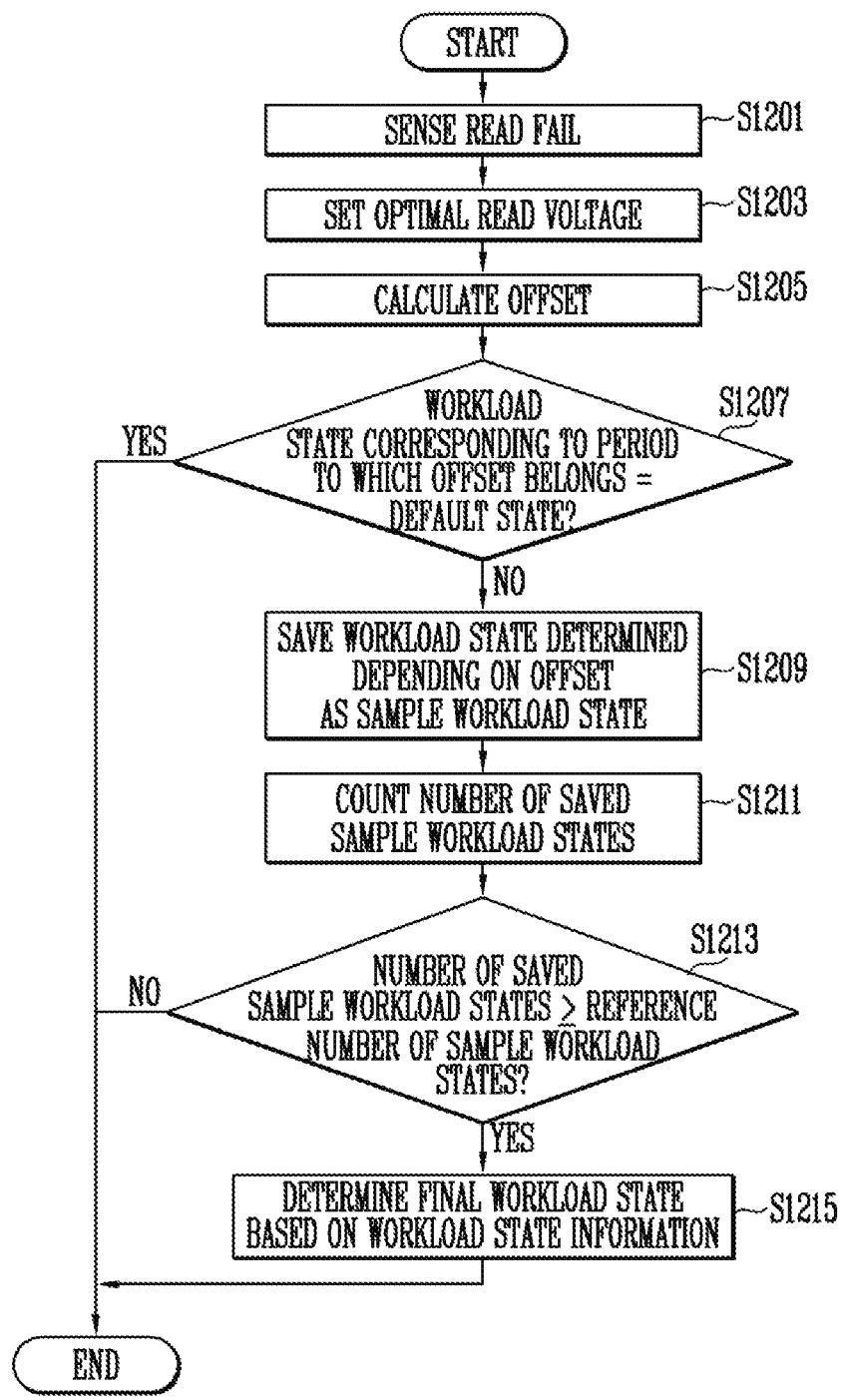
FIG. 12 is a flowchart illustrating a workload state determination operation performed by a memory controller in accordance with an embodiment of the present disclosure.

FIG. 12 is a flowchart illustrating a workload state determination operation performed by a memory controller, e.g., memory controller 200, in accordance with an embodiment of the present disclosure.

Referring to FIG. 12, at step S1201, the memory controller may sense a read fail when a read operation of reading memory cells using a default read voltage fails.

At step S1203, the memory controller may set an optimal read voltage based on the default read voltage when the read fail is sensed. The optimal read voltage may be a voltage for reading memory cells on which the read operation has failed.

At step S1205, the memory controller may calculate an offset which is a difference between the optimal read voltage and the default read voltage.

At step S1207, the memory controller may determine whether a workload state corresponding to an interval to which the offset belongs is a default state, based on the results of comparisons between the offset and a plurality of workload reference values. When it is determined that the workload state is the default state, the process is terminated; otherwise the process proceeds to step S1209.

At step S1209, the memory controller may save the workload state determined based on the offset as a sample workload state. The sample workload state may be saved whenever the read fail is sensed at S1201 and the calculated offset at S1205 does not belong the interval corresponding to the default state. Hence, one or more sample workload states may be saved until the number of saved sample workload states is equal to or greater than a reference number of sample workload states.

At step S1211, the memory controller may count the number of saved sample workload states.

At step S1213, the memory controller may determine whether the number of saved sample workload states is equal to or greater than a reference number of sample workload states. When the number of sample workload states is equal to or greater than the reference number of sample workload states, the process proceeds to step S1215; otherwise the process is terminated.

At step S1215, the memory controller may determine a final workload state based on workload state information including the saved sample workload states. The final workload state may be a sample workload state corresponding to the largest offset, among the saved sample workload states. The memory controller may delete the workload state information after determining the final workload state.

Figure 13:
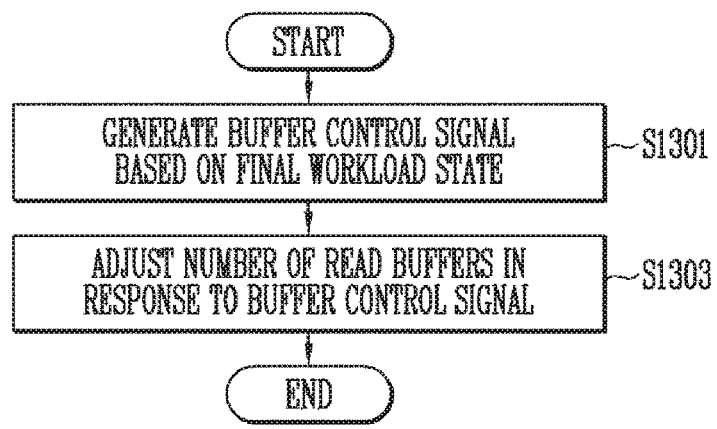
FIG. 13 is a flowchart illustrating an operation of adjusting the number of read buffers, performed by a memory controller, in accordance with an embodiment of the present disclosure.

FIG. 13 is a flowchart illustrating an operation of adjusting the number of read buffers, performed by a memory controller, e.g., memory controller 200, in accordance with an embodiment of the present disclosure.

Referring to FIG. 13, at step S1301, the memory controller may generate a buffer control signal based on a final workload state.

At step S1303, the memory controller may adjust the number of read buffers included in the buffer group in response to the generated buffer control signal.

Figure 14:
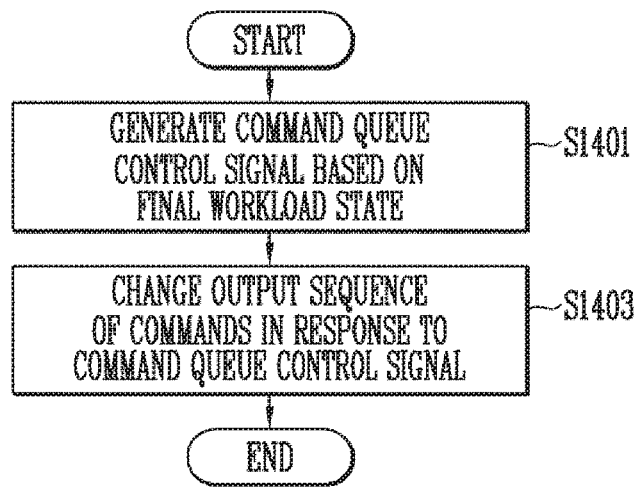
FIG. 14 is a flowchart illustrating an operation of changing a command output sequence, performed by a memory controller, in accordance with an embodiment of the present disclosure.

FIG. 14 is a flowchart illustrating an operation of changing a command output sequence, performed by a memory controller, e.g., memory controller 200, in accordance with an embodiment of the present disclosure.

Referring to FIG. 14, at step S1401, the memory controller may generate a command queue control signal based on a final workload state.

At step S1403, the memory controller may change a queueing order of commands in a command queue in response to the generated command queue control signal. In detail, the queueing order may be changed such that a read command queued in the command queue is output prior to a write command originally queued prior to the read command.

Figure 15:
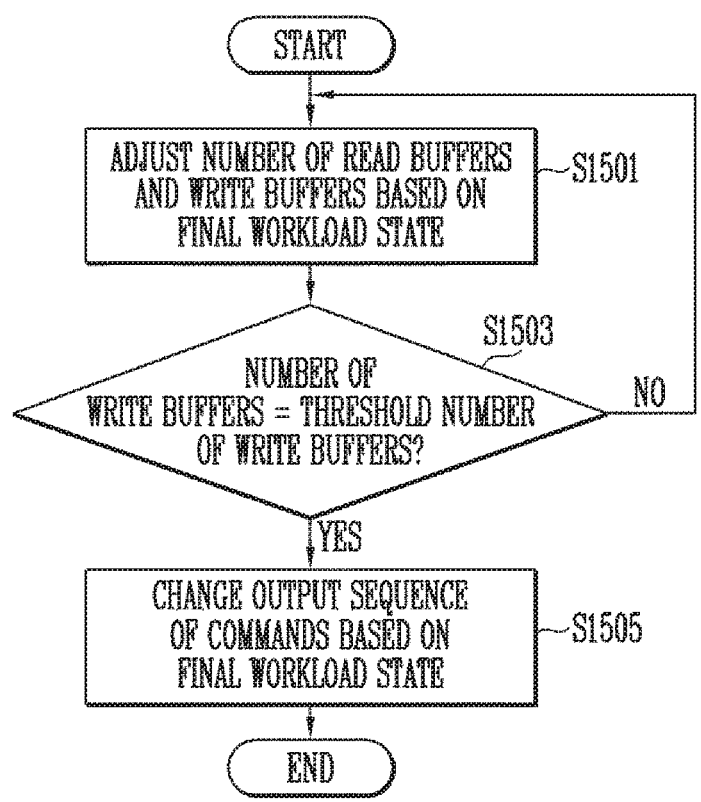
FIG. 15 is a flowchart illustrating the operation of a memory controller in accordance with an embodiment of the present disclosure.

FIG. 15 is a flowchart illustrating the operation of a memory controller, e.g., memory controller 200, in accordance with an embodiment of the present disclosure.

Referring to FIG. 15, at step S1501, the memory controller may adjust the number of read buffers and the number of write buffers based on a final workload state.

At step S1503, the memory controller may determine whether the number of write buffers is equal to the threshold number of write buffers, which number represents the minimum number of write buffers required. When it is determined that the number of write buffers is equal to the threshold number of write buffers, the process proceeds to step S1505; otherwise the process returns to step S1501.

At step S1505, the memory controller may change the order in which commands are queued in a command queue based on the final workload state.

Figure 16:
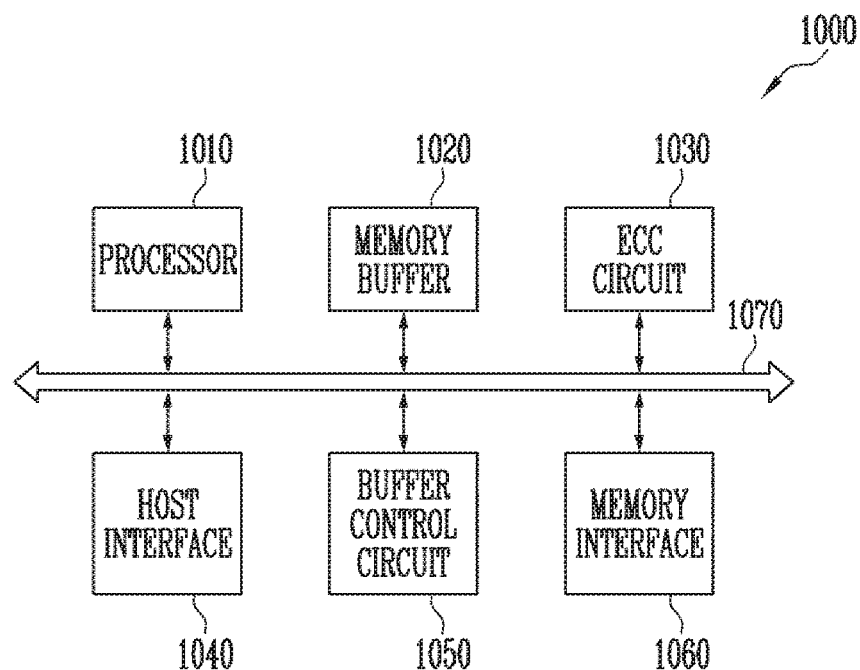
FIG. 16 is a diagram illustrating an embodiment of the memory controller of FIG. 1.

FIG. 16 is a diagram illustrating an embodiment of the memory controller of FIG. 1.

Referring to FIG. 16, a memory controller 1000 is coupled to a host and a memory device, e.g., to host 300 and memory device 100 of FIG. 1. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Various address mapping methods performed through the FTL may be used according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

In an embodiment, the processor 1010 may run software or firmware to perform randomizing and derandomizing operations.

The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. The ECC circuit 1030 may be disposed in the memory interface 1060 as a component thereof.

The host interface 1040 may communicate with the external host under the control of the processor 1010. The host interface 1040 may perform communication using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may exchange commands, addresses, and data with the memory device through channels.

In an embodiment, the memory controller 1000 may not include the memory buffer 1020 and the buffer control circuit 1050. That is, one or both of these components may be provided separately or functions thereof may be distributed within the memory controller 1000.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, so as not to interfere with, nor influence, each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 17:
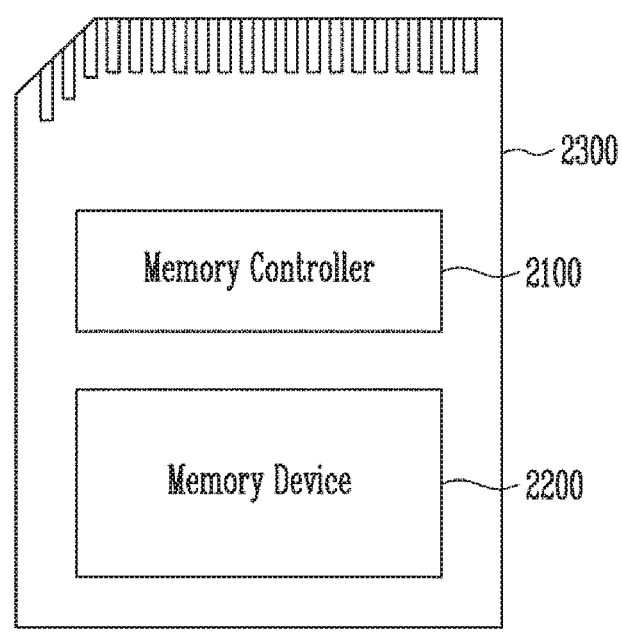
FIG. 17 is a block diagram illustrating a memory card system to which a storage device is applied in accordance with an embodiment of the present disclosure.

FIG. 17 is a block diagram illustrating a memory card system to which the storage device in accordance with an embodiment of the present disclosure is applied.

Referring to FIG. 17, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200 described above with reference to FIG. 1.

In an embodiment, the memory controller 2100 may include components, such as a RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of these communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), or a Spin-Torque Magnetic RAM (STT-MRAM).

The memory controller 2100 and the memory device 2200 may be integrated into a single semiconductor device to configure a memory card, such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 18:
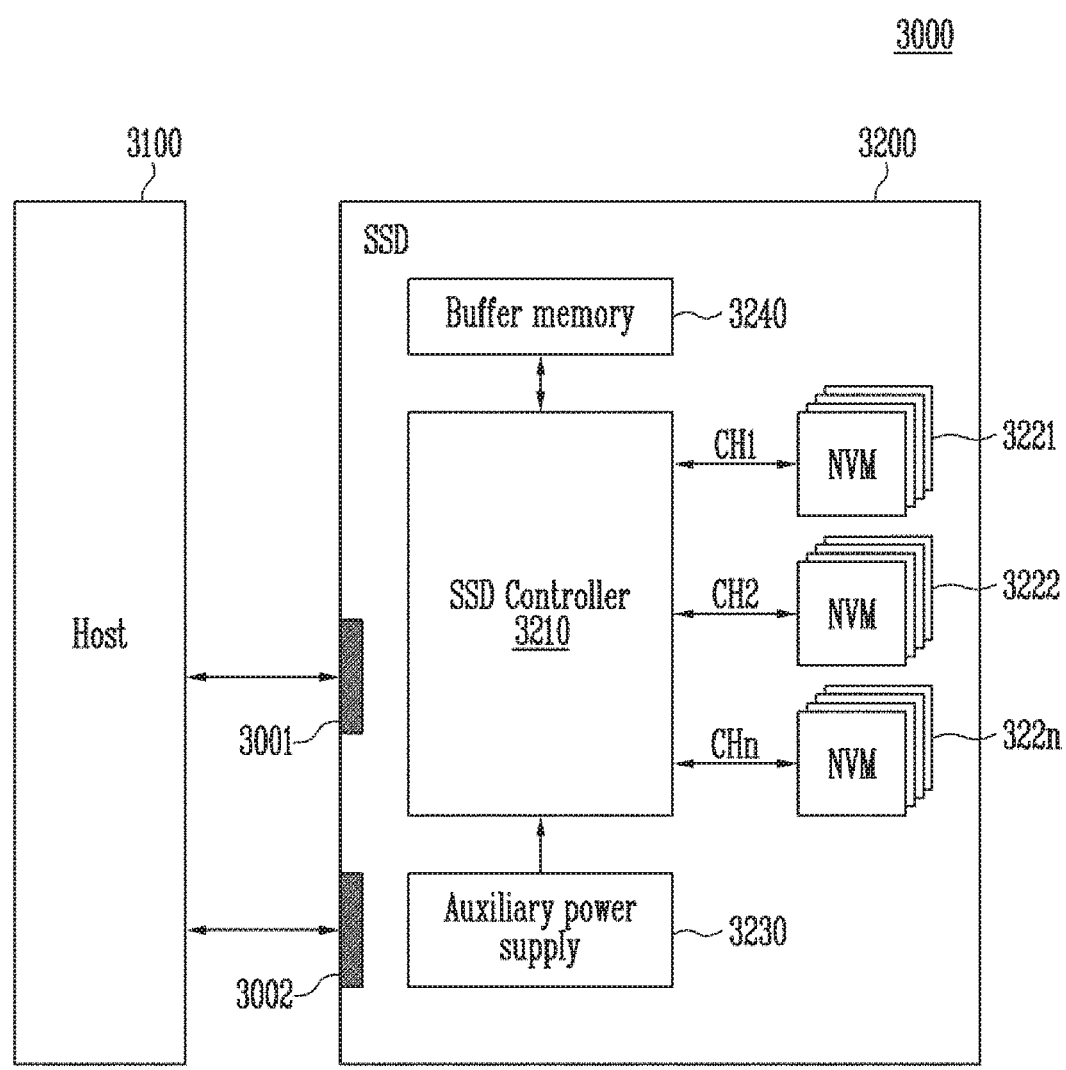
FIG. 18 is a block diagram illustrating a solid state drive (SSD) system to which a storage device is applied in accordance with an embodiment of the present disclosure.

FIG. 18 is a block diagram illustrating a solid state drive (SSD) system to which the storage device is applied in accordance with an embodiment of the present disclosure.

Referring to FIG. 18, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces, such as universal serial bus (USB), multimedia card (MMC), embedded MMC (eMMC), peripheral component interconnection (PCI), PCI-express (PCI-e or PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be disposed within the SSD 3200. In another embodiment, the auxiliary power supply 3230 may be a separate component external to the SSD 3200. For example, the auxiliary power supply 3230 may be disposed in a main board and may supply auxiliary power to the SSD 3200.

The buffer memory 3240 may serve the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may implemented as any of various volatile memories such as DRAM, SDRAM, DDR SDRAM, LPDDR SDRAM, and GRAM or as any of various nonvolatile memories such as FRAM, ReRAM, STT-MRAM, and PRAM.

FIG. 19 is a block diagram illustrating a user system to which the storage device is applied in accordance with an embodiment of the present disclosure.

Referring to FIG. 19, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may be implemented as any of various volatile RAMs such as DRAM, SDRAM, DDR SDRAM, DDR2 SDRAM, DDR3 SDRAM, LPDDR SDRAM, and LPDDR3 SDRAM, or implemented as any of various nonvolatile RAMs such as PRAM, ReRAM, MRAM, and FRAM. In an embodiment, the application processor 4100 and the memory module 4200 may be packaged based on package-on-package (POP) into a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device 100 described above with reference to FIG. 1. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a storage device, which provides firmware optimized for a user's working environment, and a method of operating the storage device are provided.

While various embodiments of the present disclosure have been disclosed, those skilled in the art will appreciate in light of the present disclosure that various modifications, additions and substitutions are possible, without departing from the scope and spirit of the present invention. Therefore, the scope of the present invention is defined by the appended claims and their equivalents, rather than by the description preceding them.

In the above-discussed embodiments, in some cases one or more steps may be selectively performed or skipped. In addition, the steps may not always be sequentially performed in given order, and may be randomly performed. Furthermore, the embodiments disclosed herein aim to help those with ordinary knowledge in this art more clearly understand the present invention, rather than aiming to limit the bounds of the present invention. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present invention as defined in the appended claims and their equivalents.

What is claimed is:

1. A memory controller for controlling a memory device that includes a plurality of memory cells, the memory controller comprising:
    a workload determination circuit configured to determine a workload state indicating an operating pattern of the memory device based on optimal read voltages for reading the plurality of memory cells when a read operation performed on the memory cells fails;
    an operating environment setting circuit configured to set an operating environment of the memory device based on the workload state; and
    a buffer group including a plurality of read buffers and a plurality of write buffers,
    wherein the operating environment setting circuit adjusts a number of read buffers and a number of write buffers based on the workload state.

2. The memory controller according to claim 1, wherein the workload state indicates whether more read operations are performed in the operating pattern than in a default operating pattern.

3. The memory controller according to claim 2, wherein the workload determination circuit determines the workload state based on offsets that are differences between default read voltages and the optimal read voltages determined based on the default read voltages.

4. The memory controller according to claim 3, wherein the workload determination circuit comprises:
a workload table configured to store workload reference information indicating a plurality of workload states corresponding, respectively, to a plurality of reference intervals;
a workload state determination circuit configured to determine a plurality of sample workload states based on select reference intervals, among the plurality of reference intervals;
a state information storage configured to store workload state information indicating the plurality of sample workload states; and
a state information counter configured to count the plurality of sample workload states to generate a counted number.

5. The memory controller according to claim 4, wherein the state information counter is configured to generate a state output signal when the counted number is equal to or greater than a reference number.

6. The memory controller according to claim 5,
wherein the workload state determination circuit determines a final workload state in response to the state output signal and provides the workload state to the operating environment setting circuit, and
wherein the final workload state is a sample workload state corresponding to a reference interval having a largest offset, among the plurality of sample workload states.

7. The memory controller according to claim 2, further comprising:
a command queue configured to queue commands and output the commands to the memory device.

8. The memory controller according to claim 7, wherein the operating environment setting circuit comprises:
an operating environment setting table configured to store buffer control information about adjustment of the number of read buffers or the number of write buffers and store command queue control information indicating a queueing order of the commands queued in the command queue;
a buffer controller configured to adjust the number of read buffers or the number of write buffers based on the buffer control information and a final workload state; and
a command queue controller configured to adjust the queueing order based on the command queue control information and the final workload state.

9. The memory controller according to claim 8, wherein the command queue controller is configured to adjust the queueing order such that at least one read command of the commands is output prior to a write command originally queued prior to the at least one read command to the memory device.

10. A method of operating a memory controller for controlling a memory device that includes a plurality of memory cells, the method comprising:
setting optimal read voltages for reading the plurality of memory cells when a read operation performed on the memory cells fails;
determining a workload state indicating an operating pattern of the memory device based on the optimal read voltages; and
setting an operating environment of the memory device based on the workload state,
wherein setting the operating environment of the memory device comprises adjusting a number of read buffers and a number of write buffers based on the workload state, and
wherein the read buffers and the write buffers are included in a buffer group.

11. The method according to claim 10, wherein the workload state indicates whether more read operations are performed in the operating pattern than in a default operating pattern.

12. The method according to claim 11, wherein determining the workload state comprises determining the workload state based on offsets that are differences between default read voltages and the optimal read voltages determined based on the default read voltages.

13. The method according to claim 11, wherein adjusting the number of read buffers and the number of write buffers comprises increasing the number of read buffers and decreasing the number of write buffers.

14. The method according to claim 13, further comprising adjusting a queueing order of commands in a command queue when the number of write buffers reaches a threshold number of write buffers.

15. A storage device, comprising:
a memory device including a plurality of memory cells and configured to perform a read operation on the plurality of memory cells; and
a memory controller configured to determine a workload state indicating an operating pattern of the memory device based on optimal read voltages for reading the plurality of memory cells when the read operation fails, and configured to set an operating environment of the memory device based on the workload state,
wherein the memory controller adjusts a number of read buffers and a number of write buffers based on the workload state, and
wherein the read buffers and the write buffers are included in a buffer group.

16. The storage device according to claim 15, wherein the workload state indicates whether more read operations are performed in the operating pattern than those in a default operating pattern.

17. The storage device according to claim 16, wherein the memory controller is configured to determine the workload state based on offsets that are differences between default read voltages and the optimal read voltages determined based on the default read voltages.

18. The storage device according to claim 17, wherein the memory controller is further configured to adjust a queueing order of commands in a command queue.

19. A storage device comprising:
a memory device configured to perform a read operation with reference read voltages; and
a memory controller that includes plural buffers and a command queue, and is configured to perform, when the read operation is performed more than a set number of times during a set period, at least one of a first and a second operation based on difference between a default reference read voltage and a last reference read voltage,
wherein the first operation is an operation of adjusting assignment of the buffers as read buffers and write buffers,
wherein the second operation is an operation of adjusting an order of commands queued in the command queue to prioritize a read command among the queued commands, and wherein the last reference read voltage is used in a last-performed read operation.

\* \* \* \* \*